United States Patent [19]
Bassily et al.

[11] Patent Number: 5,620,529
[45] Date of Patent: Apr. 15, 1997

[54] LOW DISTURBANCE SOLAR ARRAY

[75] Inventors: Samir F. Bassily, Los Angeles; Stuart F. Bockman, Torrance; George N. Young, Los Angeles, all of Calif.

[73] Assignee: Hughes Electronics, Los Angeles, Calif.

[21] Appl. No.: 552,811

[22] Filed: Nov. 3, 1995

[51] Int. Cl.$^6$ .................................................. H01L 31/045
[52] U.S. Cl. .......................... 136/245; 136/292; 244/173
[58] Field of Search .................................. 136/245, 292; 244/173

[56] References Cited

U.S. PATENT DOCUMENTS 4,394,529  7/1983  Gounder ................................... 136/245
5,520,747  5/1996  Marks ...................................... 136/245

FOREIGN PATENT DOCUMENTS 4215599  8/1992  Japan ...................................... 136/245

*Primary Examiner*—Aaron Weisstuch
*Attorney, Agent, or Firm*—Elizabeth E. Leitereg; Terje Gudmestad; Wanda K. Denson-Low

[57]  ABSTRACT

A rigid panel solar array for a spacecraft. The layers of materials for the panels are selected and oriented to control the net coefficient of thermal expansion in the array's longitudinal direction. Some of the layers are discontinuous and softly coupled to the others by flexible adhesive materials. The panels are interconnected with hinge members which are positioned at appropriate locations and with appropriate degrees of freedom so that thermally induced transverse bending does not cause transverse motion of the center-of-mass of the panels.

34 Claims, 2 Drawing Sheets

LOW DISTURBANCE SOLAR ARRAY

TECHNICAL FIELD

The present invention relates to solar arrays for orbiting spacecraft.

BACKGROUND OF THE INVENTION

The present invention relates to solar arrays for satellites, and more particularly to rigid panel solar arrays designed to cause minimal disturbance to their host spacecraft as the spacecraft passes through the transition zones between lightness and darkness.

Spacecraft today use a number of various types of solar panels and solar arrays, including rigid panel solar arrays and flexible panel solar arrays. Rigid arrays have a number of benefits over flexible arrays. For example, for a given solar cell total surface area, rigid arrays have lower solar torque, lower aero torque, and lower gravity gradient pitch torque. Rigid arrays also have a higher flexible mode frequency and are less expensive to design and produce than flexible arrays.

One of the drawbacks of rigid panel solar arrays consists of the solar thermal snap effects which are caused when the spacecraft passes through the transition zones between lightness and darkness (a/k/a the terminator). Solar snap, or thermal snap, can result from motion/acceleration of the solar array center-of-mass when the temperature changes rapidly as the spacecraft enters or exits an eclipse. Since the array is two-dimensional in nature, the motion of the center-of-mass can result from thermal distortions (bending) in either its longitudinal or transverse directions. Some attempts have been made to minimize the thermal snap by using composite face sheet materials having low coefficients of thermal expansion (CTE). Merely using face sheet materials having low coefficients of thermal expansion, however, does not account for the effect of the solar cells and the central core materials on thermal deformation. Also, if designed to provide minimal coefficient of thermal expansion in one direction, the composite face sheet material typically will have a significant coefficient of thermal expansion in the orthogonal direction.

It is an object of the present invention to provide a rigid panel solar array for a spacecraft which is an improvement over known rigid panel solar arrays. It is also an object of the present invention to provide an improved solar array which causes minimal disturbance to its host spacecraft as the spacecraft passes through the terminator (sunrise and sunset).

It is another object of the present invention to provide a solar array which has a lower cost and is more reliable than systems today using more complex flexible array technology.

It is still another object of the present invention to provide a rigid panel solar array which reduces solar thermal snap effects when operating in a low earth orbit (LEO) environment. It is a still further object of the present invention to provide a rigid panel solar array which has minimal bending in the longitudinal direction and only moderate bending in the transverse direction, with the disturbance effect of the moderate transverse direction bending being rendered negligible through the appropriate location and design of the attachment points (hinges) such that the distortion does not result in a shift in the panel's center of mass (CM).

These and other objects, features and benefits of the present invention will become apparent from the following description of the invention when viewed in accordance with the accompanying drawings and appended claims.

SUMMARY OF THE INVENTION

The present invention provides a solar array comprised of a series of rigid panels connected together by hinges. The panels incorporate several layers and types of materials which control the net coefficient of thermal expansion of the array in the longitudinal direction. Each of the panels includes face sheets of tailored lay-up materials and a central lightweight core material, both of which are oriented such that they reduce the impact on the net coefficient of thermal expansion in the longitudinal direction. The panels have a moderate coefficient of thermal expansion in the transverse direction resulting in cylindrical bending of the panels as the array enters and exits sunlight in its orbit.

The hinges attaching and interconnecting the array panels are positioned at appropriate locations and with appropriate degrees of freedom so that thermally induced transverse bending does not cause panel center-of-mass motion. The centers of mass of the panels do not translate as the panels undergo cylindrical bending. As a result, spacecraft disturbances due to the coefficient of thermal expansion of the array in the transverse direction are rendered negligible.

The present invention reduces solar thermal snap effects in rigid arrays operating in low earth orbit environments. This allows use of rigid array technology on low earth orbit spacecraft which have tighter pointing requirements, taking advantage of their simple and proven deployment mechanisms. This also results in lower cost and a more reliable system than one using more complex flexible array technology. The tighter cell packing density also provides lower environmental torques on the spacecraft. In addition, the rigid panel solar arrays possess higher flex mode frequencies which lead to less interaction with the spacecraft attitude control system. Finally, the present invention allows a more robust guidance, navigation and control system design for the spacecraft.

The present invention can also be used for other two-dimensional spacecraft appendages, such as large radar antennas. Similar low distortion or low disturbance advantages can be secured.

DESCRIPTION OF THE PREFERRED EMBODIMENTS

Figure 1:
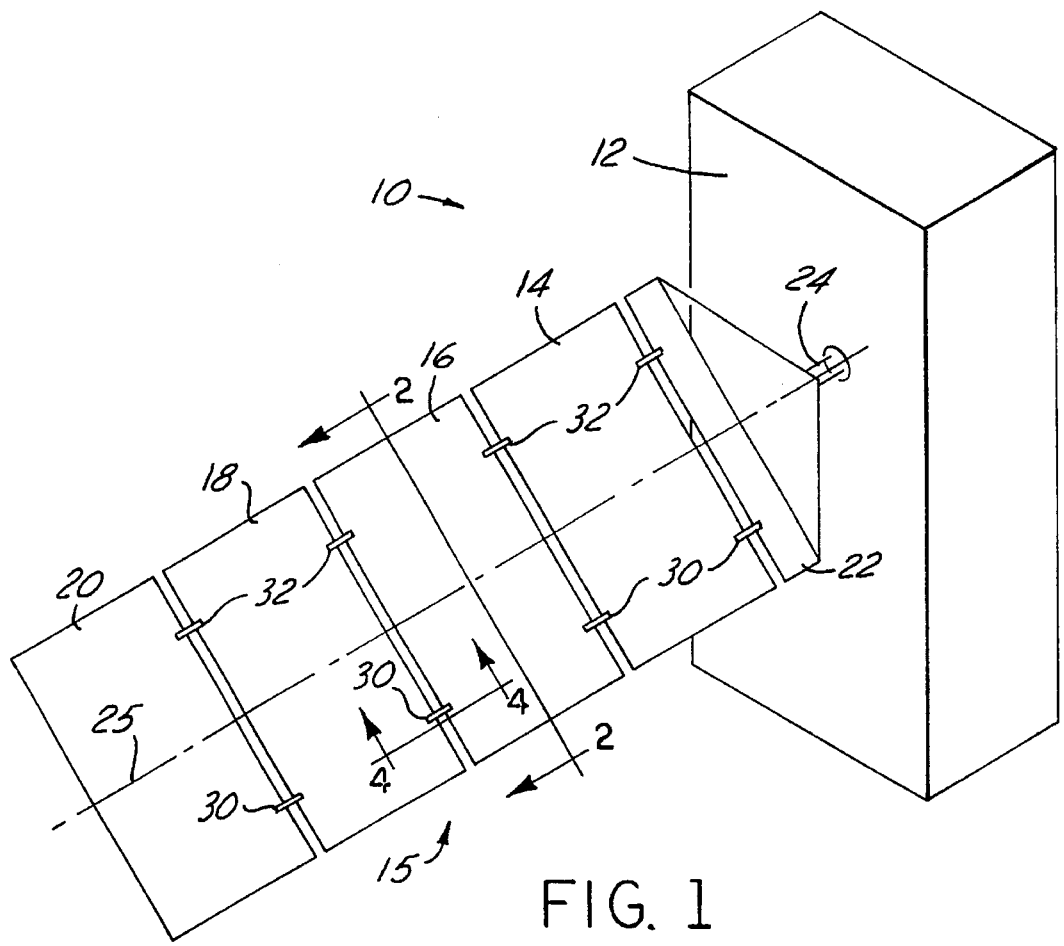
FIG. 1 is a schematic view of a spacecraft utilizing the present inventive rigid panel solar array.

A spacecraft utilizing the present invention is shown schematically in FIG. 1 and is designated by the reference numeral 10. The spacecraft has a body 12 and a rigid panel solar array 15.

The solar panel array 15 consists of a series of panel members 14, 16, 18, and 20. Although four panel members are shown with respect to the solar array in FIG. 1, it is understood that any number of solar panel members (e.g. 2 to 7) can be utilized with the array in accordance with design considerations and mission requirements.

The body 12 of the spacecraft is shown generally and schematically since the present invention can be utilized with any type of low earth orbit (LEO) spacecraft. In this regard, the body 12 typically will have a number of components, antennas, and other accessories (not shown).

The solar array 15 is connected to the spacecraft body 12 through an electronic assembly 22. The assembly 22 is a bus voltage limiter (BVL) which regulates the power produced by the solar panels and limits the voltage sent to the spacecraft. The electronic assembly is secured to the spacecraft body by a shaft 24. The shaft 24 can be rotated as desired by conventional motors and other rotating mechanisms in the spacecraft body 12 in order to orient and point the solar array 15 in a desired direction.

Figure 4:
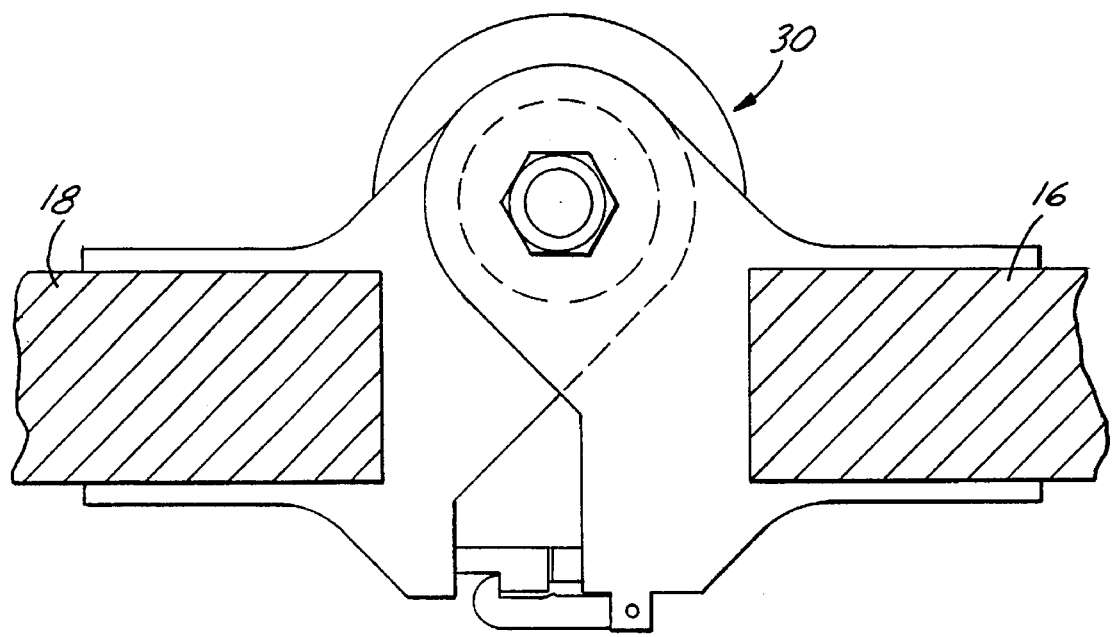
FIG. 4 illustrates one of the hinges used in the inventive array, FIG. 4 being taken along lines 4—4 in FIG. 1 and in the direction of the arrows.

The solar panel members of the solar array are connected together by pairs of hinge members 30 and 32. The same pair of hinge members 30, 32 are positioned between each of the panels 14, 16, 18, and 20 and between panel 14 and the electronic assembly 22. The hinge members are conventional mono-ball-type hinges. In their locked (deployed) position (shown in FIG. 4), hinge members 30 have two degrees of freedom, designated by the arrows 30a and 30b in FIG. 3. Hinge members 32 have a single rotational degree of freedom 32a.

It is understood, of course, that the degrees of freedom of the hinges 30 and 32 could be reversed (i.e. hinge 30 could have one degree of freedom and hinge 32 could have two degrees of freedom). It is also understood that other types of conventional spacecraft hinge mechanisms with appropriate degrees of freedom could be utilized, as needed.

The materials used for each of the solar panel members 14, 16, 18, and 20 are selected and oriented such that the solar panel array has a minimal coefficient of expansion in the longitudinal direction. In this regard, the longitudinal axis of the solar array 15 is indicated by the reference numeral 25 in FIG. 1. The solar panel members are also designed to moderate the coefficient of thermal expansion in the transverse direction, that is, in the direction perpendicular to the longitudinal axis 25.

Figure 2:
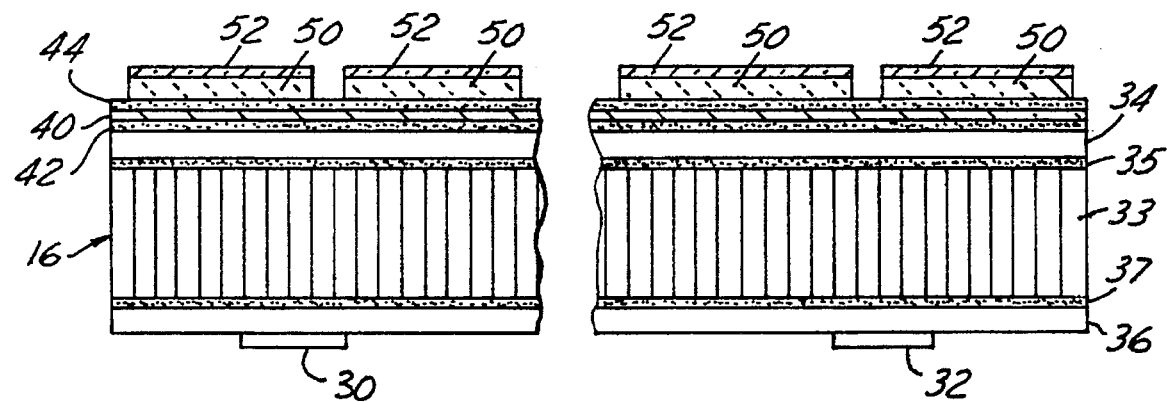
FIG. 2 is a cross-sectional view of one of the solar panels of FIG. 1 taken along lines 2—2 in FIG. 1 and in the direction of the arrows.

The design of each of the solar panel members is shown in cross-sectional view of representative rigid panel member 16 in FIG. 2. Solar panel member 16 has an aluminum honeycomb core 33 and a pair of graphite/cyanate ester face sheets 34 and 36. These face sheets are secured to the honeycomb core by an epoxy film adhesive indicated as layers 35 and 37.

A layer of Kapton polyimide insulating film 40 is secured to one side of each of the solar panel members. The film 40 is secured to the adjacent face sheet 34 by a layer of RTV (Room Temperature Vulcanizing) silicon rubber adhesive 42. The solar cells 50 are secured to the Kapton insulating film 40 by another layer of RTV soft silicon rubber adhesive 44. Protective glass covers 52 are secured to each of the solar cells.

Preferably, the aluminum honeycomb core is 1.5 inches thick and has a density of one pound per cubic foot. The graphite/cyanate ester face sheet is preferably type M40J and approximately 0.024 inch in thickness. The Kapton insulating film is preferably 0.002 inch thick, while the RTV adhesive layers are typically 0.005 inch in thickness. The solar cells 50 are typically made from a thin layer of gallium arsenide material on a 0.0055 inch thick germanium substrate. The glass covers 52 are typically on the order of 0.003 inch in thickness.

As indicated, the invention uses multiple layers of different materials to form each of the solar panel members. Some of the layers are discontinuous and softly coupled to the others by flexible adhesive materials. In this regard, it is understood that other equivalent materials could be used for the materials of the composite solar panel. For example, the face sheet material could be any graphite reinforced plastic material, the adhesive material could be an appropriate adhesive other than epoxy, and the insulating layer could be any appropriate insulating material.

The solar cells are typically 6.2×7.2 cm in size. The smaller dimension of the solar cell is preferably placed in the longitudinal direction of the solar panel array in order to reduce the cell's effect on longitudinal array bending. The layer of Kapton is placed between the cells and the graphite substrate face sheet to provide insulation against conductive graphite whiskers. The effect of the solar cells on the longitudinal coefficient of thermal expansion of the array is minimized by attachment through the two layers of flexible RTV adhesive.

The honeycomb core density is minimized and its stiffer, ribbon, direction is placed in the array's transverse direction. This reduces its effect on the coefficient of thermal expansion in the longitudinal direction.

Each of the face sheets 34 and 36 of the solar panel members are made from a series of plies of a composite material, preferably seven plies. Lamination theory utilizing ply properties was used to pick the angles for the orientation of the plies. In the preferred embodiment of the present invention, the face sheet made from the M40J graphite with cyanate ester 954-3 resin has seven plies of material oriented at 0°, ±13°, 90°, ±13°, and 0° relative to the longitudinal direction of the array 25. This layup was dependent on the particular graphite material utilized and was selected such that it produced a face sheet CTE sufficiently negative to cancel the positive effect of the honeycomb core and solar cells on the overall CTE of the panel and array.

The RTV preferably should have a glass transition temperature well below the temperatures that the array are subjected to during use. The phase change increases the RTV sheer stiffness, resulting in stronger structural coupling with the array cells. This can result in significant additional transients at sunrise due to the stronger effect from the cell CTE and the relaxation of RTV stiffness that occurs shortly after sunrise as the array warms to the glass transition temperature.

The present invention would typically remain above nominal glass transition temperature at a 700 km orbit, due to sufficient Earth infrared heating during the eclipse. However, in a geosynchronous orbit this heating would be minimal and the temperature of the array would dip below glass transition during longer eclipses. The orbit attitude at which glass transition is reached will be dependent upon specific factors such as the thermal mass and emissivities of the array, and whether or not the array is being off-pointed from the sun line.

As noted above, each rigid panel member 16, 18, 20, and 22 is attached using pairs of hinges. The hinges allow twisting as well as motion about the hinge line and one hinge member 30 in each pair of hinges allows translation along the hinge line.

Figure 3:
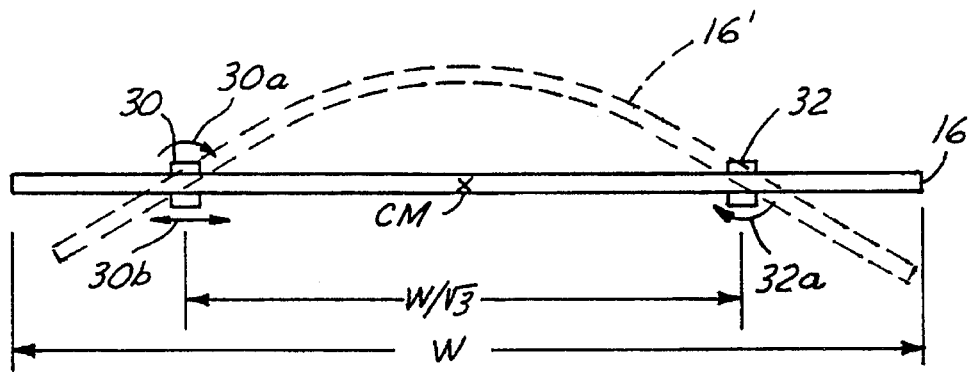
FIG. 3 depicts the location of the hinges and the transverse bending performance of the rigid panel solar array in accordance with the present invention.

In accordance with the present invention, the hinges are placed so that the center of mass (CM) of each panel does not translate as the panel undergoes cylindrical bending. This feature is shown in FIG. 3. Since the coefficient of thermal expansion in the longitudinal direction is minimized, the coefficient of thermal expansion in the transverse direction provides moderate expansion and contraction of the panels resulting in a curvature or bending thereof. In order to prevent the CM of the panel from translating as the panel undergoes cylindrical bending, the hinges are symmetrically placed at a distance ($\frac{1}{2}\sqrt{3}$) W or about 0.29 W from the panel center line, where W is the width of the panel. As the panel member 16 undergoes cylindrical bending, it is shown in exaggerated form in phantom lines and referenced by the number 16'. It is also understood that the curvature of the array and panels can be in either the + or − direction.

Symmetrically locating the hinges while spacing them at a distance equal to the width of the array W divided by the square root of three ($\sqrt{3}$) results in a stable center-of-mass location regardless of the panel radius of curvature (provided the mass of the panel is uniformly distributed across its transverse direction). In this manner, the center portion of each of the solar panel members can move in either direction since the motion of the center and the ends of the panel cancel each other.

On the other hand, if the panel mass is not uniformly distributed across the transverse direction (e.g. if heavier edge stiffeners are incorporated along the longitudinal edges of the panel), a different location can generally be determined at which the hinges can be located in order to result in a stable CM location as the panel curves.

An alternate embodiment of the present invention could compensate for the effect of imperfections in the reduction process of the longitudinal coefficient of thermal expansion by appropriately adjusting the location of the array attachment hinges. This would allow for cancellation of longitudinal bending disturbances by an equal and opposite disturbance driven by panel center of mass motion due to transverse bending. An additional embodiment would be to selectively place the panels in each of the arrays such that the panels with the largest measured coefficient of thermal expansion in the longitudinal direction are placed near the free end of the array where their effect would be minimal.

Since the invention relies on achieving unrestrained cylindrical bending, rigid attachment to the power electronics or other hardware should be avoided, along with any other attachment which might restrain the transverse bending of the panel through stiffening, or shielding part of the substrate from thermal transients. In this regard, use of the present invention in applications entailing shadowing of the array at sunset or sunrise are not optimal. Shadowing of part of a panel would result in a deviation from cylindrical bending. The shadowed part of the panel would act as a boundary constraint on the illuminated portion of the panel, typically resulting in some longitudinal bending.

In tests with one embodiment of the present invention, the coefficient of thermal expansion in the longitudinal direction was in a range of about ±0.10 PPM/F°, depending upon the temperature. (PPM means "parts per million".) The coefficient of thermal expansion in the transverse direction was about 3.3 PPM/°F.

In accordance with the present invention, the effect of transverse expansion is minimized with the placement of the hinges. In addition, the coefficient of thermal expansion in a longitudinal direction is minimized with the face sheet stiffness/thickness control, lightweight core, and a thin substrate for the solar cells attached with layers of a silicone rubber material separated with a thin insulating film. The present invention causes near zero reaction on the host spacecraft when the spacecraft passes through the terminator (sunrise and sunset).

Although particular embodiments of the present invention have been illustrated in the accompanying drawings and described in the foregoing detailed description, it is to be understood that the present invention is not to be limited to just the embodiments disclosed, but that they are capable of numerous rearrangements, modifications and substitutions without departing from the scope of the claims hereafter.

It is claimed:

1. A solar array for a spacecraft, said array having a longitudinal axis, said array comprising:

a plurality of rigid solar panel members connected together in series along said longitudinal axis; and pairs of hinge members positioned between and connecting together each of said panel members;

said hinge members being symmetrically positioned substantially at ($\frac{1}{2}\sqrt{3}$)W, where W is the width of said panel members;

wherein the movement of the center of mass of said solar panel members in a direction transverse to said longitudinal axis during thermal induced transverse bending of said solar panel members is substantially minimized; and wherein one of said hinge members of each of said pairs of hinge members has transverse and rotational degrees of freedom, while the other of said hinge members has at least a rotational degree of freedom.

2. The solar array as set forth in claim 1 wherein each of said rigid solar panel members is comprised of a plurality of layers of material secured together, said layers of materials being provided and oriented to minimize the coefficient of thermal expansion of said panel member in the direction of said longitudinal axis.

3. The solar array as set forth in claim 2 wherein each of said rigid solar panel members comprises:

a central honeycomb member having two planar surfaces;

a first layer of face sheet material positioned on a first planar surface of said honeycomb material and a second layer of face sheet material positioned on a second planar surface of said honeycomb material;

an insulating layer positioned on said first layer of face sheet material; and a plurality of solar cells positioned on said insulating layer.

4. The solar array as set forth in claim 2 wherein said coefficient of thermal expansion in the direction of said longitudinal axis is about ±0.10 PPM/F°.

5. The solar array as set forth in claim 4 wherein the coefficient of thermal expansion in a direction transverse to said longitudinal axis is about 3.3 PPM/F°.

6. A method for making a protruding substantially two-dimensional member for a spacecraft in order to minimize effects of the member on the spacecraft due to thermal forces, said protruding member having a longitudinal axis and being constructed of a plurality of rigid panel members connected together in series along said longitudinal axis, said method comprising the steps of:

constructing a plurality of rigid panel members, each of said panel members comprising a composite of layers of materials oriented to minimize the coefficient of thermal expansion in the direction of said longitudinal axis;

interconnecting said panel members together in series with pairs of hinge members; and positioning each of said pairs of hinge members symmetrically substantially at (½√3)W, where W is the width of said panel members so that thermally induced transverse bending of said panel members does not cause transverse motion of the center-of-mass of said panels;

wherein one of the hinges of each of said pairs of hinge members has transverse and rotational degrees of freedom, while the other of said hinge members has at least a rotational degree of freedom.

7. The method as set forth in claim 6 further comprising the steps of determining the coefficient of thermal expansion of each panel member in the direction of said longitudinal axis prior to interconnecting the panels together, and positioning the panel member with the largest such coefficient of thermal expansion at a position on said protruding member furthest from the spacecraft body.

8. The method as set forth in claim 6 wherein said protruding member is a solar array and said panel members are rigid solar panels with a plurality of solar cells thereon.

9. The method as set forth in claim 6 wherein said protruding member is an antenna.

10. A substantially two-dimensional protruding member for a spacecraft, said protruding member having a longitudinal axis and comprising:

a plurality of rigid panel members connected together in series along said longitudinal axis;

each of said panel members comprising a plurality of layers of materials secured together;

said materials on each of said panel members being oriented to minimize the coefficient of thermal expansion thereof in the direction of said longitudinal axis; and a pair of hinge members connecting together each of said rigid panel members, said pairs of hinge members being symmetrically positioned substantially at (½√3)W, where W is the width of said panel members so that thermally induced transverse bending of said panel members does not cause transverse motion of the center-of-mass of said panels;

wherein one of the hinges of each of said pairs of hinge members has transverse and rotational degrees of freedom, while the other of said hinge members has at least a rotational degree of freedom.

11. A solar array for a spacecraft, said array having a longitudinal axis, said array comprising:

a plurality of rigid solar panel members connected together in series along said longitudinal axis;

each of said solar panel members comprising a central core member having two planar surfaces, a first layer of face sheet material positioned on a first planar surface of said core material, a second layer of face sheet material positioned on a second planar surface of said core material, an insulating layer positioned on said first layer of face sheet material, and a plurality of solar cells positioned on said insulating layer;

said plurality of solar cells having a first coefficient of thermal expansion in the direction of said longitudinal axis;

said first and second layers of face sheet material each comprising composites made from a plurality of plies of material, said plies being oriented to provide a second coefficient of thermal expansion in each of said layers in the direction of said longitudinal axis; and said second coefficient of thermal expansion counter balancing and substantially neutralizing said first coefficient of thermal expansion.

12. The solar array as set forth in claim 11 wherein said core member is made from an aluminum honeycomb material and has its ribbon direction positioned transverse to said longitudinal axis, wherein the stiffness of said honeycomb material is reduced in the direction of said longitudinal axis.

13. The solar array as set forth in claim 11 wherein said first and second layers of face material are made from a graphite/cyanate ester material.

14. The solar array as set forth in claim 11 wherein said first and second layers of face material are secured to said core member by an epoxy film adhesive material.

15. The solar array as set forth in claim 11 wherein said insulating layer is made from a Kapton insulating film.

16. The solar array as set forth in claim 11 wherein said insulating layer is secured to said face sheet material by a soft rubber adhesive material.

17. The solar array as set forth in claim 11 wherein said solar cells are secured to said insulating layer by a soft rubber adhesive material.

18. The solar array as set forth in claim 11 wherein at least seven plies of material are provided in each of said first and second layers of face material, said plies being oriented at 0°, ±13°, 90°, ±13° and 0° relative to the direction of said longitudinal axis.

19. The solar array as set forth in claim 11 further comprising hinge means connecting together each of said rigid solar panel members.

20. The solar array as set forth in claim 19 wherein a pair of hinges are provided between each of said rigid solar panel members, said hinges being symmetrically positioned substantially at (½√3)W, where W is the width of said panels.

21. The solar array as set forth in claim 20 wherein one of said hinges of each of said pair of hinges has transverse and rotation degrees of freedom, while the other of said hinges has at least a rotational degree of freedom.

22. The solar array as set forth in claim 11 wherein said net coefficient of thermal expansion in the direction of said longitudinal axis is about ±0.10 PPM/F°.

23. The solar array as set forth in claim 11 wherein the coefficient of thermal expansion in a direction transverse to said longitudinal axis is about 3.3 PPM/F°.

24. The solar array as set forth in claim 11 wherein four solar panel members are provided.

25. The solar array as set forth in claim 11 wherein said solar array further comprises an electronic assembly.

26. The solar array as set forth in claim 11 wherein each of said solar cells is rectangular in shape with two shorter edges and two longer edges, and said solar cells are positioned on said solar panel members with said shorter edges being parallel to said longitudinal axis.

27. A rigid panel member for a solar array for a spacecraft, said panel member having a first axis and a second axis transverse to said first axis, said panel member comprising:

a core member;

a first layer of face sheet material positioned on a first side of said core member;

a second layer of face sheet material positioned on a second side of said core member;

an insulating layer positioned on said first layer of face sheet material; and a plurality of solar cells positioned on said insulating layer;

said plurality of solar cells having a first coefficient of thermal expansion in the direction of said first axis;

said first and second layers of face sheet material each comprising composites made from a plurality of plies of material, said plies being oriented to provide a second coefficient of thermal expansion in each of said layers in the direction of said first axis; and said second coefficient of thermal expansion counter balancing and substantially neutralizing said first coefficient of thermal expansion.

28. The rigid panel member as set forth in claim 27 wherein said core member is made from an aluminum honeycomb material and has its ribbon direction positioned transverse to said first axis, wherein the stiffness of said honeycomb materials is reduced in the direction of said first axis.

29. The rigid panel member as set forth in claim 27 wherein said first and second layers of face material are made from a graphite/cyanate ester material.

30. The rigid panel member as set forth in claim 27 wherein said first and second layers of face material are secured to said core member by an epoxy film adhesive material.

31. The rigid panel member as set forth in claim 27 wherein said insulating layer is made from a Kapton insulating film.

32. The rigid panel member as set forth in claim 27 wherein said insulating layer is secured to said face sheet material by a soft rubber adhesive material.

33. The rigid panel member as set forth in claim 27 wherein said solar cells are secured to said insulating layer by a soft rubber adhesive material.

34. The rigid panel member as set forth in claim 27 wherein at least seven plies of material are provided in each of said first and second layers of face material, said plies being oriented at 0°, ±13°, 90°, ±13° and 0° relative to the direction of said first axis.

* * * * *